(12) United States Patent
Chou et al.

(10) Patent No.: US 7,639,557 B1
(45) Date of Patent: Dec. 29, 2009

(54) CONFIGURABLE RANDOM-ACCESS-MEMORY CIRCUITRY

(75) Inventors: Hao-Yuan Howard Chou, Fremont, CA (US); Haiming Yu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 304 days.

(21) Appl. No.: 11/714,327

(22) Filed: Mar. 5, 2007

(51) Int. Cl.
*G11C 8/00* (2006.01)

(52) U.S. Cl. .................. 365/230.05; 365/230.01; 365/230.02; 365/230.03; 365/189.04; 365/189.011; 365/220; 711/149

(58) Field of Classification Search ............ 365/230.05, 365/230.01, 230.02, 230.03, 189.04, 189.011, 365/220; 711/149
See application file for complete search history.

(56) References Cited

U.S. PATENT DOCUMENTS

| | | | | |
|---|---|---|---|---|
| 5,253,203 | A * | 10/1993 | Partovi et al. | ......... 365/189.02 |
| 6,127,843 | A | 10/2000 | Agrawal et al. | |
| 6,400,635 | B1 | 6/2002 | Ngai et al. | |
| 6,452,863 | B2 | 9/2002 | Farmwald et al. | |
| 6,556,502 | B2 | 4/2003 | Ngai et al. | |
| 7,071,731 | B1 * | 7/2006 | Choe et al. | ................ 326/40 |
| 7,110,304 | B1 | 9/2006 | Yu et al. | |
| 7,130,238 | B1 | 10/2006 | Yu et al. | |
| 2004/0066697 | A1 * | 4/2004 | Nagano | ............... 365/230.05 |

* cited by examiner

*Primary Examiner*—VanThu Nguyen
*Assistant Examiner*—Eric Wendler
(74) *Attorney, Agent, or Firm*—Treyz Law Group; G. Victor Treyz; Nancy Y. Ru

(57) ABSTRACT

Integrated circuits such as programmable logic device integrated circuits are provided that have memory arrays that may be configured for true dual port operation or simple dual port operation. The memory arrays include memory cells arranged in rows and columns and associated row address lines and data lines. Sense amplifiers and write drivers are used for reading and writing data. Precharge drivers are used to precharge the data lines prior to read operations. Configurable multiplexer circuitry in the array has read paths through which data is provided to the sense amplifiers from the memory cells. The multiplexer circuitry has write paths through which data from the write drivers is written into the memory cells. The read paths and the write paths contain no more than a single pass gate each. Each precharge driver may be connected to a respective one of the data lines with no intervening pass gates.

20 Claims, 6 Drawing Sheets

| Mode | a_we | acol[MSB] | a_we0 | a_we1 |
|---|---|---|---|---|
| X | 0 | X | 0 | 0 |
| TDPx18 | 1 | 0 | 1 | 0 |
| | 1 | 1 | 0 | 1 |
| SDPx36 | 1 | X | 1 | 0 |

| Mode | b_we | bcol[MSB] | b_we0 | b_we1 | b_we36 |
|---|---|---|---|---|---|
| X | 0 | X | 0 | 0 | 0 |
| TDPx18 | 1 | 0 | 1 | 0 | 0 |
| | 1 | 1 | 0 | 1 | 0 |
| SDPx36 | 1 | X | 0 | 0 | 1 |

| Mode | a_re | acol[MSB] | a_col0 | a_col1 | R36 |
|---|---|---|---|---|---|
| X | 0 | X | 0 | 0 | 0 |
| TDPx18 | 1 | 0 | 1 | 0 | 0 |
| | 1 | 1 | 0 | 1 | 0 |
| SDPx36 | 1 | X | 0 | 0 | 1 |

| Mode | b_re | bcol[MSB] | b_col0 | b_col1 |
|---|---|---|---|---|
| X | 0 | X | 0 | 0 |
| TDPx18 | 1 | 0 | 1 | 0 |
| | 1 | 1 | 0 | 1 |
| SDPx36 | 1 | X | 0 | 1 |

CONFIGURABLE RANDOM-ACCESS-MEMORY CIRCUITRY

BACKGROUND

This invention relates to random-access-memory circuits, and more particularly, to circuitry for reading and writing data from a random-access memory circuit that may be configured as a true dual port memory or a simple dual port memory.

Memory arrays are used in integrated circuits such as integrated circuit memories and programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools help the designer to implement the custom logic circuit using the resources available on a given programmable logic device. When the design process is complete, the CAD tools generate configuration data files. The configuration data is loaded into programmable logic devices to configure them to perform the desired custom logic function.

Programmable logic devices may contain configurable random-access-memory arrays. A configurable random-access-memory array can be configured as a true dual port memory or as a simple dual port memory, as needed by a logic designer.

Configurable random-access-memory arrays have multiplexer circuitry. The multiplexer circuitry is used to route input and output data signals from the memory cells in the array.

Conventional configurable random-access-memory arrays use multiplexer circuitry in which data and precharge signals traverse multiple pass gates. Some of the pass gates are complementary metal-oxide-semiconductor (CMOS) pass gates that are used for both read and write operations. The use of these pass gates tends to create circuit loading effects that can slow device performance during precharging and during data read and write operations.

It would therefore be desirable to be able to provide improved configurable random-access-memory arrays for integrated circuits such as programmable logic device integrated circuits.

SUMMARY

In accordance with the present invention, memory arrays for integrated circuits such as programmable logic device integrated circuits are provided. The memory arrays may be configured to operate in true dual port mode or simple dual port mode.

Each configurable memory array has memory cells arranged in rows and columns. Row address lines and data lines are associated with the memory cells. Each memory array has configurable multiplexer circuitry. Sense amplifiers receive signals from the memory cells and data lines through read paths in the multiplexer circuitry. Write drivers write signals onto the data lines and into the memory cells through write paths in the multiplexer circuitry. Precharge drivers may precharge the data lines prior to read operations on the memory cells.

The multiplexer circuitry may contain pass gates that are controlled by control signals. The pass gates may contain n-channel metal-oxide-semiconductor (NMOS) and p-channel metal-oxide-semiconductor (PMOS) pass gates. A flat multiplexer structure may be used in which each read path contains no more than a single PMOS pass gate and in which each write driver contains no more than a single NMOS pass gate. Pairs of the precharge drivers may be connected to associated pairs of the data lines with no intervening pass gates.

Further features of the invention, its nature and various advantages will be more apparent from the accompanying drawings and the following detailed description of the preferred embodiments.

BRIEF DESCRIPTION OF THE DRAWINGS

FIG. 8 is a truth table for the write-path multiplexer control signals associated with the data line multiplexer circuitry of FIG. 7 in accordance with an embodiment of the present invention.

FIG. 9 is a truth table for the read-path multiplexer circuitry control signals associated with the data line multiplexer circuitry of FIG. 7 in accordance with an embodiment of the present invention.

DETAILED DESCRIPTION

The present invention relates to multiplexing circuitry for configurable memory arrays. Memory arrays, which are sometimes referred to as memory blocks or memory regions, contain rows and columns of memory cells. The memory cells may, in general by any suitable nonvolatile or volatile memory cells. In a typical scenario, the memory cells are volatile random-access memory cells.

The memory arrays may be part of any suitable integrated circuits, such as application specific integrated circuits (e.g., video application specific integrated circuits), electrically programmable and mask-programmable programmable logic device integrated circuits, digital signal processors, microprocessors, microcontrollers, and memory chips. If desired, the memory arrays of the present invention may be used in programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic and one or more memory blocks.

The present invention is sometimes described herein in connection with memory arrays on programmable logic device integrated circuits. This is, however, merely illustrative. Multiplexer circuitry for configurable memory arrays in accordance with the invention may be used in connection with a memory array on any suitable integrated circuit if desired.

Figure 1:
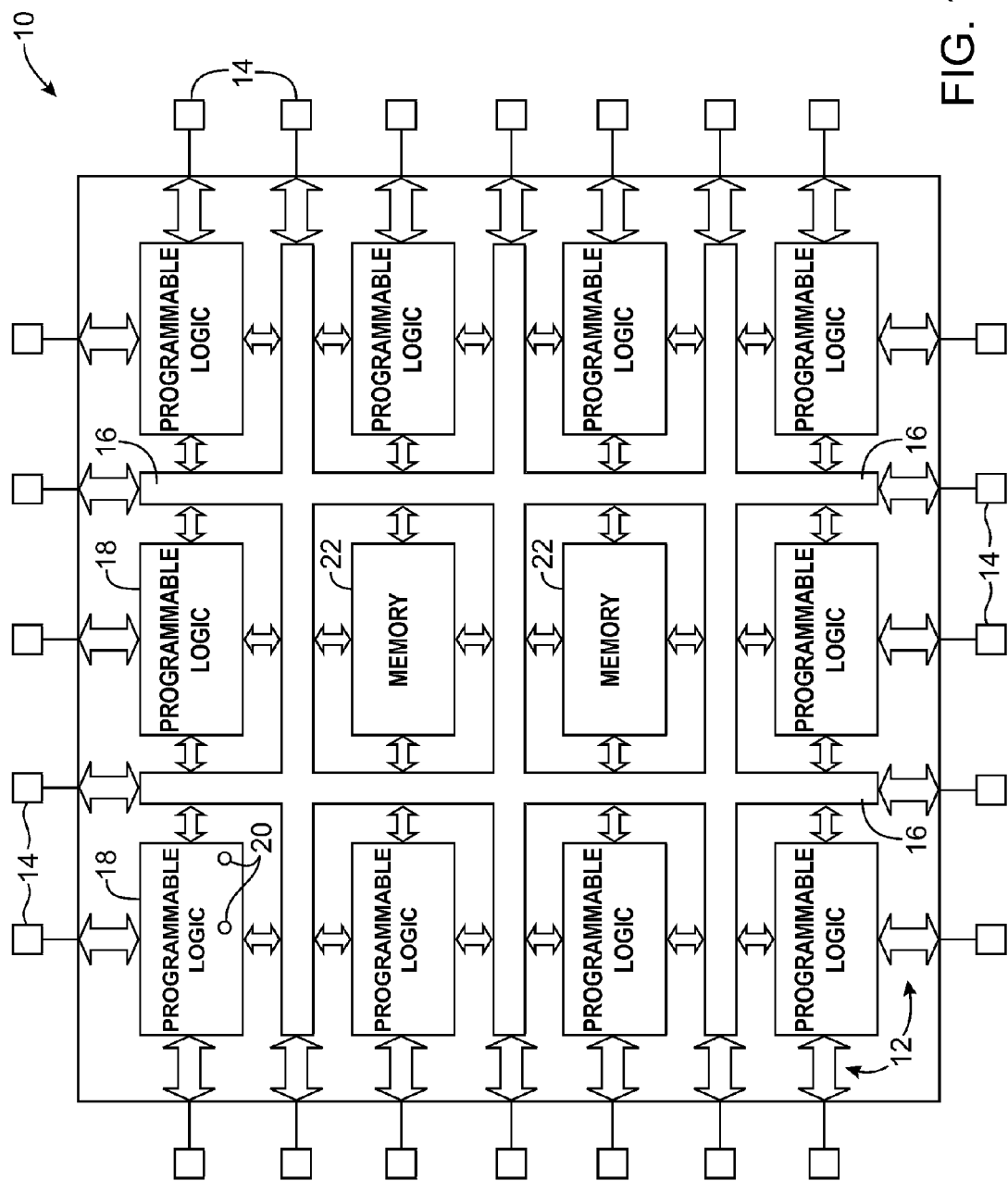
FIG. 1 is a diagram of an illustrative programmable logic device integrated circuit in accordance with an embodiment of the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include conductive lines and programmable connections between respective conductive lines and are therefore sometimes referred to as programmable interconnects 16.

Programmable logic device 10 contains programmable logic 18 and memory blocks 22.

Programmable logic 18 may include combinational and sequential logic circuitry. The programmable logic 18 may be configured to perform a custom logic function. The programmable interconnects 16 may be considered to be a type of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory or configuration RAM. Mask-programmed programmable logic devices, which are sometimes referred to as structured application specific integrated circuits, are programmed by using lithographic masks to create a custom pattern of connections in an array of vias based on configuration data.

Memory arrays 22 contain rows and columns of volatile memory elements such as random-access-memory (RAM) cells. The memory arrays 22 are used to store data signals during normal operation of device 10. The memory arrays 22 need not all be the same size. For example, small, medium, and large memory arrays 22 may be included on the same programmable logic device. There may, for example, be hundreds of small memory arrays each having a capacity of about 512 bits, 2-9 large memory arrays each having a capacity of about half of a megabit, and an intermediate number of medium size memory arrays each having a capacity of about 4 kilobits. These are merely illustrative memory array sizes and quantities. In general, there may be any suitable size and number of memory arrays 22 on device 10. There may also be any suitable number of regions of programmable logic 18.

During normal use in a system, memory elements 20 are generally loaded with configuration data from a configuration device integrated circuit via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass gates, look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

All or some of memory arrays 22 may be dual port memories. Dual port memories have two ports. During operation, both ports can be used simultaneously, subject to certain restrictions. For example, data may be read from a first port at the same time as data is being read from a second port. The way in which simultaneous activity involving write operations is handled can vary depending on the way in which a given dual port memory array is implemented. With one suitable arrangement, it is possible to perform a read operation on one port while simultaneously performing a write operation on the other port, but only the write operation is guaranteed to be successful. Simultaneous write operations on both ports may be prohibited.

Data is written into memory arrays 22 and is read out from memory arrays 22 over data lines (also sometimes referred to as bit lines). Column address lines and row address lines (sometimes referred to as word lines) are asserted during read and write operations so that data is written or read at a desired location in a memory array.

The number of data lines that are used in parallel to read or write data is referred to as the data width of the memory array. Different modes of operation may be supported each corresponding to a different data width. Consider, as an example, the situation in which memory array 22 has 36 columns of cells. Each port in this type of dual port memory array 22 may be configured to operate in a x1 mode in which data is conveyed on 1 data line, a x2 mode in which data is conveyed on two parallel lines, a x4 mode in which four parallel data lines are used, a x9 mode in which 9 parallel data lines are used, or a x18 mode in which 18 data lines.

If there are 36 pairs of data lines available to convey data into and out of the array, two ports (i.e., ports A and B) can read and write data simultaneously (subject to the certain constraints such as prohibited simultaneous write operations). When array 22 is configured in this way, it is sometimes said to be operating in true dual port mode, because each port is able to access the contents of memory array 22 independently.

Array 22 may also be configured to operate in a mode that is sometimes referred to as simple dual port mode. In simple dual port mode, one port (the read port) is dedicated to supporting read operations while the other port (the write port) is dedicated to supporting write operations. The read and write circuitry of array 22 is configured so that up to 36 parallel data lines may be used by the reading port and up to 36 parallel data lines may be used by the writing port. Each port in simple dual port mode can therefore support up to a x36 data width mode.

Arrays 22 that can be placed in either true dual port mode or simple dual port mode are sometimes referred to as configurable memory arrays. Array 22 can be configured using any suitable control signals. With one suitable arrangement, array 22 is configured by loading configuration data into device 10 (i.e., using static control signals produced by memory elements 20).

Figure 2:
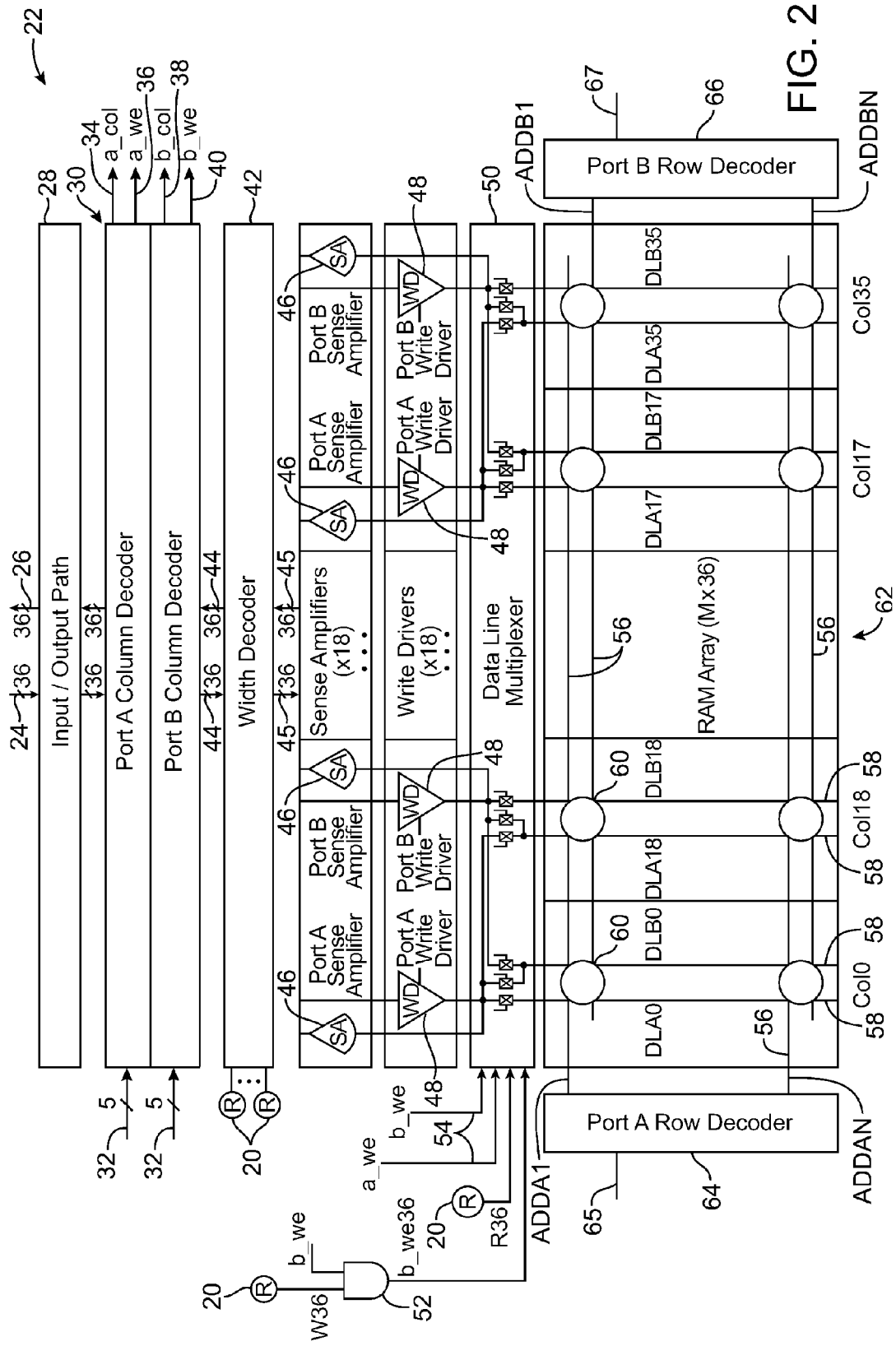
FIG. 2 is a diagram of an illustrative configurable memory array for an integrated circuit such as a programmable logic device integrated circuit in accordance with an embodiment of the present invention.

An illustrative configurable memory array 22 that supports true dual port mode and simple dual port mode is shown in FIG. 2. In the example of FIG. 2, memory array 22 has 36 associated input lines 24 and 36 associated output lines 26. Lines 24 and 26 may be used to convey data between array 22 and other circuitry on device 10 such as programmable logic 18.

Input-output path circuitry 28 include input-output registers for array 22.

Column address decoder 30 may include port A column decoder circuitry and port B column decoder circuitry. Address lines 32 may be used supply column address signals to column address decoder 30 for decoding. In response, column address decoder 30 produces control signals for random-access memory cell array 62. As shown in FIG. 2, address decoder 30 may produce write enable signals a_we (for port A) and b_we (for port B), on lines 36 and 40, respectively. Decoder 30 may produce column address control signal a_col on line 34 and column address control signal control signal b_col on line 38.

Width decoder 42 may be configured using control signals such as static control signals from programmable elements 20. Width decoder 42 routes signals between lines 44 and lines 45. In x36 data width mode, there is a 1:1 mapping between lines 44 and lines 45. In other data width modes, width decoder 42 maps 36 lines 44 into a smaller number of lines 45 for ports A and B (e.g., 1 of 18 lines for each port in x1 mode, 2 of 18 for x2 mode, 4 of 18 for x4 mode, 9 of 18 for x9 mode, and 18 of 18 for x18 mode).

Sense amplifiers 46 receive data signals from data lines 58 in array 62 and produce correspondingly strengthened data output signals on lines 45 during data read operations. During write operations, write drivers 48 are used to drive data signals from lines 45 into array 62 on data lines 58. The sense amplifiers 46 that are associated with port A during true dual port mode are labeled "port A" in FIG. 2. The sense amplifiers 46 that are associated with port B during true dual port mode are labeled "port B" in FIG. 2.

Write drivers 48 are used to drive signals into array 62 during data writing operations. The write drivers 48 that are associated with port A during true dual port mode are labeled "port A," whereas the write drivers that are associated with port B during true dual port mode are labeled "port B."

Array 62 has random-access memory cells 60, which may be formed from cross-coupled inverters (e.g., complementary metal-oxide-semiconductor transistor inverters). Port A row decoder 64 produces port A row address signals (ADDA1 . . . ADDAN) for N rows of array 62 based on address signals received on path 65. Port B row decoder 66 produces port B address signals (ADDB1 . . . ADDBN) for N rows of array 62 based on address signals received on path 67. During a read or write, each row decoder asserts a corresponding one of its row address signals. When reading, assertion of a row address signal places the contents of the cells 60 in a given row onto data lines 58 for detection by sense amplifiers 46. When writing, assertion of a row address signal causes data from write drivers 48 that has been placed on lines 58 to be stored in certain cells 60 in a given row of array 62.

Data line multiplexer circuit 50 receives control signals such as write enable signals a_we and b_we on lines 54. Data line multiplexer circuit 50 also receives control signal b_we36 and control signal R36. Control signal R36 may be produced at the output of a programmable element 20 that has been loaded with appropriate configuration data. Control signal b_we36 may be produced at the output of a logic gate such as AND gate 52. Gate 52 may have two inputs. One input may receive a W36 control signal from the output of a corresponding programmable element 20. The other input may receive the write enable control signal b_we. In true dual port mode, write enable control signal a_we is high when writing is enabled on port A and is low during read operations on port A, whereas write enable control signal b_we is high during port B write operations and is low during port B read operations. Control signals R36 and W36 are used to place array 22 in simple dual port mode.

The control signals that are applied to data line multiplexer circuit 50 determine whether data line multiplexer circuit 50 and array 22 are configured for routing signals in true dual port mode or simple dual port mode.

In true dual port mode, the data lines 58 that are labeled DLA0 . . . DLA35 are allocated to port A and the data lines 58 that are labeled DLB0 . . . DLB35 are allocated to port B. Data may be read or written using either port.

In simple dual port mode, a read port is formed using the port A and B sense amplifiers and a write port is formed using the port A and B write drivers. As a result, both the port A and port B sense amplifiers are used to read out data from array 62 on data lines DLB in simple dual port mode, whereas both the port A and port B write drivers are used to write data into array 62 on data lines DLA in simple dual port mode.

The memory cells 60 in array 62 may be arranged in slices. Each slice includes a pair of sense amplifiers, a pair of write drivers, and two columns of associated memory cells 60. Because there are 36 columns of cells 60 in array 22 (in the present example), array 22 can be divided into 18 associated slices. Any suitable numbering scheme may be used for the columns, data lines, and slices of array 22. In the example of FIG. 2, the 0th slice of array 22 is associated with column 0 and column 18, the 1st slice of array 22 is associated with column 1 and column 19 of array 22, etc. The data lines 58 may be labeled according to the columns of memory cells 60 with which they are associated. Accordingly, data line DLA0 is the port A data line for column 0, data line DLB0 is the port B data line for column 0, data line DLA1 is the port A data line for column 1, data line DLB1 is the port B data line for column 1, etc.

Figure 3:
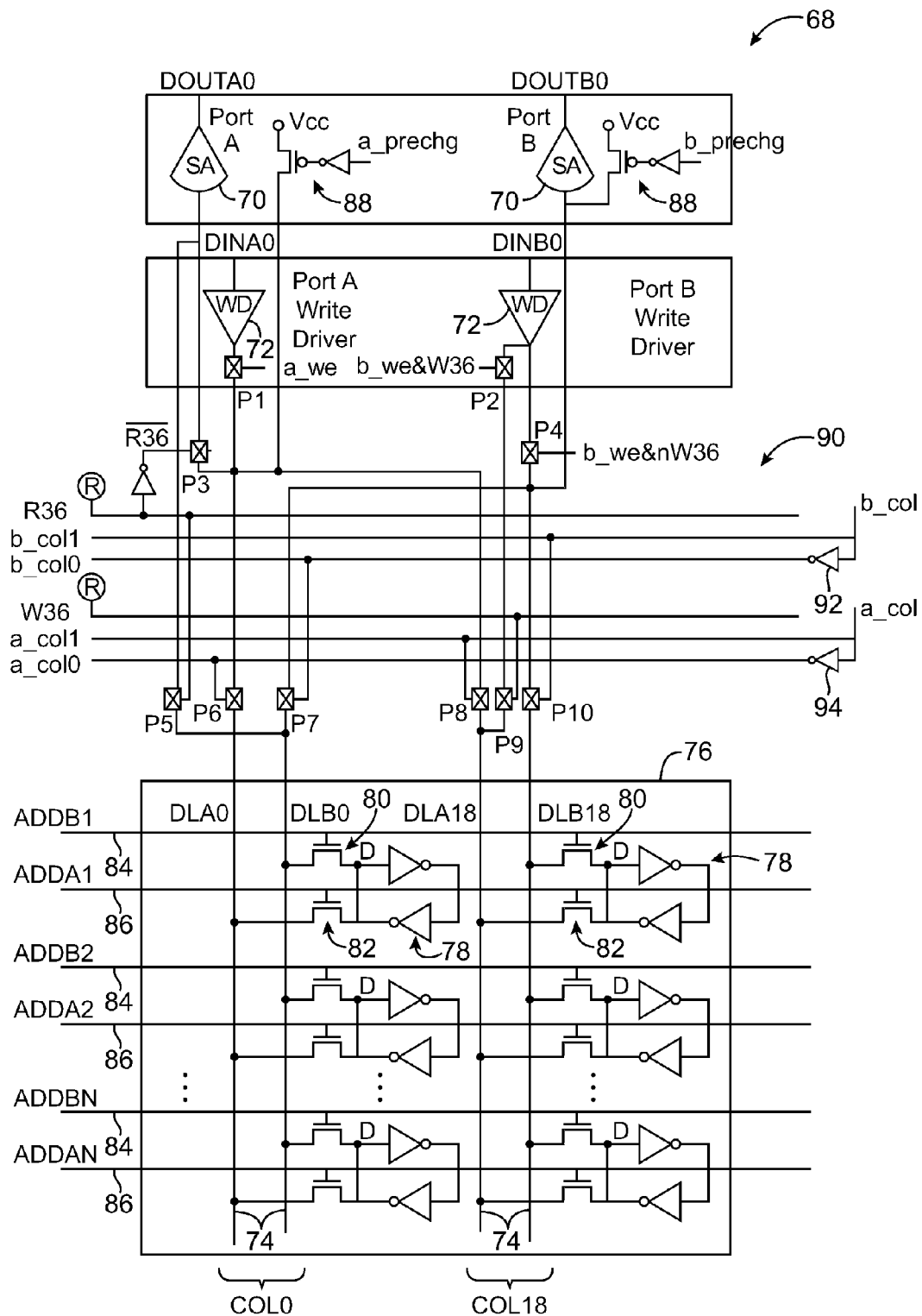
FIG. 3 is a diagram showing the use of conventional multiplexing circuitry in a configurable memory array on a programmable logic device integrated circuit.

A slice 68 of a conventional configurable dual port memory array is shown in FIG. 3. Slice 68 has sense amplifiers 70 for reading data from memory cell array 76 via data lines 74. Output data that has been read from array 76 is provided at the outputs of sense amplifiers 70 as data signals DOUTA0 (for the port A sense amplifier) and DOUTB0 (for the port B sense amplifier). Slice 68 also has write drivers 72 that drive data signals onto data lines 74 during write operations. The port A write driver handles data input signal DINA0. The port B write driver handles data input signal DINB0.

Precharge drivers 88 are used to precharge data lines 74 prior to read operations. The port A precharge driver is controlled by control signal a_prechg. The port B precharge driver is controlled by control signal b_prechg.

Multiplexer circuitry 90 has ten pass gates in slice 68, labeled P1 through P10. Multiplexer circuitry 90 is controlled by control signals R36, W36, b_col, and a_col. Inverters 92 and 94 are used to invert the signals b_col and a_col to produce signals b_col0 and a_col0, respectively. Signal b_col1 is equal to signal b_col. Signal a_col1 is equal to signal a_col.

Array 76 has memory cells 78 that are addressed using port B row address lines 84 and port A row address lines 86. Address transistors 80 are associated with row address lines 84. Address transistors 82 are associated with row address lines 86.

The signal on node D in each cell 78 represents the data stored in that cell.

Control signal R36 is low for true or simple dual port reading in data width modes x1-x18 and is high for simple dual port x36 read operations. Control signal W36 is high for simple dual port write operations in x36 mode and is low when writing in x1 to x18 data width modes (in both true and simple dual port modes).

The control signals a_col and b_col may be used to select which set of columns in the memory array are accessed.

During a read operation in x36 simple dual port mode, signal R36 is high and signal b_col is high. In this situation, both the port A and port B sense amplifiers are used for reading out data from the DLB lines (i.e., lines DLB0 and DLB18). The row address for the read operation is established by asserting a desired port B address line 84. Pass gates P5 and P10 are on, so the signal on data line DLB0 is routed through the port A sense amplifier to data output DOUTA0 and the signal on data line DLB18 is routed through the port B sense amplifier to data output DOUTB0. Both the A and B port sense amplifiers are used to read out data using the DLB lines and therefore form a x36 simple dual port read port. While data is being read from the array using this read port, data may be simultaneously written using a write port configured in a by-one to by-36 data width mode.

During a write operation in x36 simple dual port mode, control signal W36 is high, control signal a_col is low, and write enable control signals a_we and b_we are both high. Both the port A and port B write drivers are being used to write data into the DLA lines such as DLA0 and DLA18. The port A row address lines 86 are used to address the array. Pass gate P1 is turned on by the high a_we signal. Pass gate P2 is turned on because the signal b_we AND W36 is high. Pass gate P9 is also on, so the input signal DINB0 is driven onto data line DLA18 through the P2 and P9 pass gates by the port B write line driver. Pass gate P6 is on, so data input signal DINA0 is driven onto data line DLA0 by the port A write line driver through pass gates P1 and P6. Because both the A and B port write drivers are used to write data into the array using the DLA lines, the port A and B write drivers form a x36 simple dual port mode write port. While data is being written into the array using this write port, data may be simultaneously read using a read port (which can be configured in a data width mode ranging from x1 (by-one mode) to x36 (by-36 mode).

In data width modes of x18 or less (in simple dual port mode or true dual port mode), control signals R36 and W36 are low.

Port A read operations may be performed by taking write enable control signal a_we low. If control signal a_col is high, pass gate P8 will be on and pass gate P6 will be off. In this configuration, the signal on data line DLA18 will be routed to data output DOUTA0 through the port A sense amplifier 70. If control signal a_col is low, pass gate P8 will be off and pass gate P6 will be on, so the signal on data line DLA0 will be routed to data output DOUTA0 through the port A sense amplifier.

Port A write operations may be performed by taking control signal a_we high. With signal a_we high, pass gate P1 is turned on. If control signal a_col is high, pass gate P8 will be on and pass gate P6 will be off, so that input data signal DINA0 will be routed to data line DLA18 through the port A write driver 72 and pass gates P1 and P8. If control signal a_col is low, pass gate P8 will be off and pass gate P6 will be on, so that input data signal DINA0 will be routed to data line DLA0 through the port A write driver 72 and pass gates P1 and P6.

Port B read operations may be performed by taking control signal b_we low. If control signal b_col is high, pass gate P10 will be on and pass gate P7 will be off. In this configuration, the signal on data line DLB18 will be routed to data output DOUTB0 through the port B sense amplifier 70. If control signal b_col is low, pass gate P10 will be off and pass gate P7 will be on, so the signal on data line DLB0 will be routed to data output DOUTB0 through the port B sense amplifier.

Port B write operations may be performed by taking control signal b_we high. When signal W36 is low and b_we is high, control signal b_we AND W36 on the control terminal of pass gate P2 is low, turning off pass gate P2. Control signal b_we AND NOT W36 on the control terminal of pass gate P4 is high, so pass gate P4 is turned on. If control signal b_col is high, pass gate P10 will be on and pass gate P7 will be off, so that input data signal DINB0 will be routed to data line DLB18 through the port B write driver 72 and pass gates P4 and P10. If control signal b_col is low, pass gate P10 will be off and pass gate P7 will be on, so that input data signal DINB0 will be routed to data line DLB0 through the port B write driver 72 and pass gates P4 and P7.

In the conventional arrangement of FIG. 3, pass gates P6 and P8 are used for both port A read operations and port A write operations. Similarly, pass gates P10 and P7 are used for both port B read operations and port B write operations. To allow these pass gates to be used in both read and write operations, complementary metal-oxide-semiconductor (CMOS) pass gates are used that contain both n-channel metal-oxide-semiconductor (NMOS) transistors and p-channel metal-oxide-semiconductor (PMOS) transistors.

Figure 4:
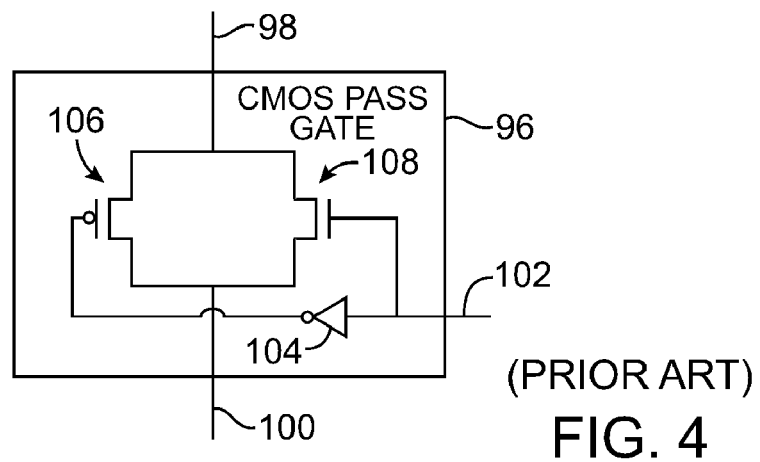
FIG. 4 is a diagram of a complementary metal-oxide-semiconductor (CMOS) pass gate of the type used in the conventional multiplexing circuitry of FIG. 3.

A conventional CMOS pass gate 96 is shown in FIG. 4. As shown in FIG. 4, CMOS pass gate 96 has a PMOS transistor 106 and an NMOS transistor 108, which are connected in parallel between terminals 98 and 100. Control signals (e.g., logic high or low signals) are applied to control terminal 102. The control signal from terminal 102 is applied to the gate of NMOS transistor 108. Inverter 104 inverts the control signal. The inverted version of the control signal is applied to the gate of PMOS transistor 106. When the control signal on line 102 is high, transistors 106 and 108 are on. When the control signal on line 102 is low, transistors 106 and 108 are off.

Parallel NMOS and PMOS transistors are used in CMOS pass gate 96 to accommodate the signals encountered in both read mode and write mode.

Consider, as an example, the situation in which data is being written into the memory array through pass gate 96. The control terminal 102 of pass gate 96 is taken high to turn the pass gate on. Terminal 98 may be connected to a write driver and terminal 100 may be connected to a data line (i.e., a DLA or DLB line in FIG. 3). During writing, the write driver may pull the line connected to terminal 98 to ground. Although both transistors 106 and 108 are nominally on, only NMOS transistor 108 will be completely on at data line voltages near to ground. The PMOS transistor 106 will not be on once its gate-source voltage drops below its threshold voltage. Thus the CMOS gate 96 relies on the presence of the NMOS transistor to effectively pull terminal 100 and its associated data line to ground.

During read operations with pass gate 96, the line attached to terminal 98 is precharged to a high voltage (i.e., a positive power supply voltage Vcc). If a memory cell 78 (FIG. 3) that is being accessed contains a logic zero (i.e., a logic signal represented by a ground signal Vss at 0 volts), that memory cell should be able to pull the precharged line from Vcc to Vss by taking terminal 100 low. In this situation, terminal 98 will initially be at the precharge voltage (Vcc), so PMOS transistor 106 will be fully on. The NMOS transistor 108 will initially be off, because when terminal 98 is high, the gate-source voltage of NMOS transistor 108 will be less than its threshold voltage Vt. As a result, the precharged line will primarily be pulled low through PMOS transistor 106.

The presence of both the NMOS and PMOS transistors in CMOS pass gate 96 therefore allows pass gate 96 to be used in both write and read operations. However, there is a performance penalty associated with dual-purpose pass gates such as these. In particular, when performing write operations, the PMOS transistor 106 in pass gate 96 represents an undesirable additional load on the circuit, and when performing read operations, the NMOS transistor 108 in pass gate 96 represents an undesirable additional load. This is because there are unavoidable parasitic capacitances and resistances associated with the transistors.

In accordance with the present invention, CMOS pass gates are avoided in the data line multiplexer, improving performance and reducing the amount of circuit real estate consumed by the multiplexer. The write paths through the data line multiplexer use NMOS pass gates and the read paths through the data line multiplexer use PMOS pass gates.

Figure 5:
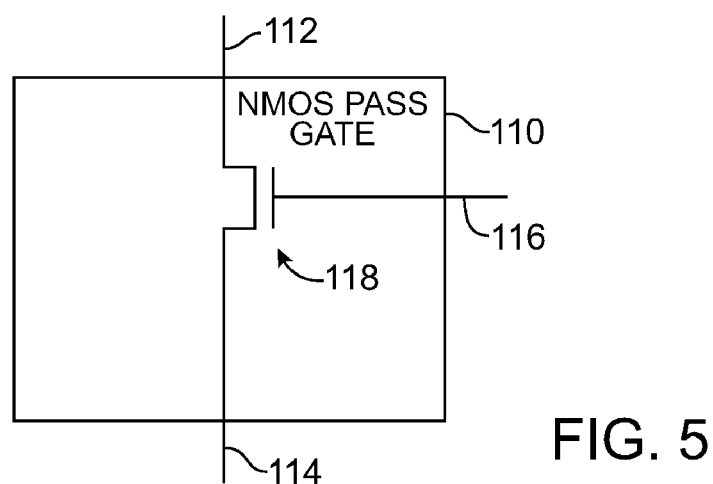
FIG. 5 is a diagram of an n-channel metal-oxide-semiconductor (NMOS) pass gate of the type that may be used in configurable memory array multiplexing circuitry in accordance with an embodiment of the present invention.

An illustrative NMOS pass gate of the type that may be used in the data line multiplexing circuitry of the present invention shown in FIG. 5. As shown in FIG. 5, NMOS pass gate 110 has input-output terminals 112 and 114. Control terminal 116 controls the gate of NMOS transistor 118. Pass gate 110 is turned on whenever the control signal on line 116 is taken high.

Figure 6:
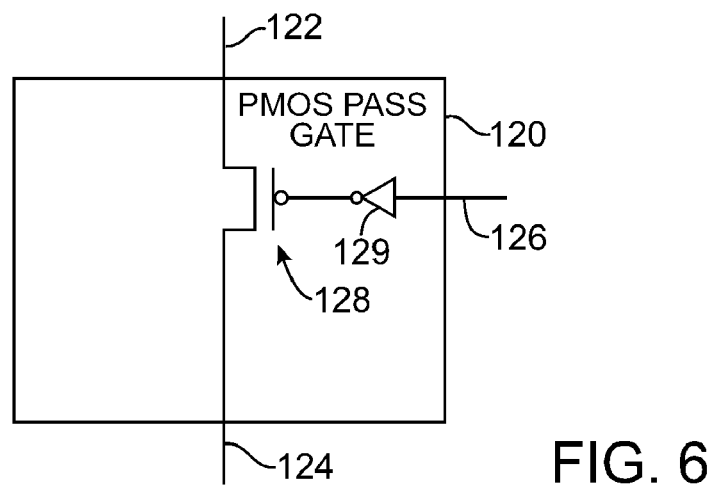
FIG. 6 is diagram of a p-channel metal-oxide-semiconductor (PMOS) pass gate of the type that may be used in configurable memory array multiplexing circuitry in accordance with an embodiment of the present invention.

An illustrative PMOS pass gate of the type that may be used in the data line multiplexing circuitry of the present invention is shown in FIG. 6. PMOS pass gate 120 of FIG. 6 has input-output terminals 122 and 124. Control terminal 126 is coupled to the gate of PMOS transistor 128. Pass gate 120 may have an inverter 129 that inverts the control signal on line 126. When inverter 129 is used, pass gate 120 will be turned on whenever the control signal on line 126 is taken high. Inverter 129 may be omitted from pass gate 120, provided that inverted control signal values are used on line 126 (i.e., a low signal is used to turn on pass gate 120).

Figure 7:
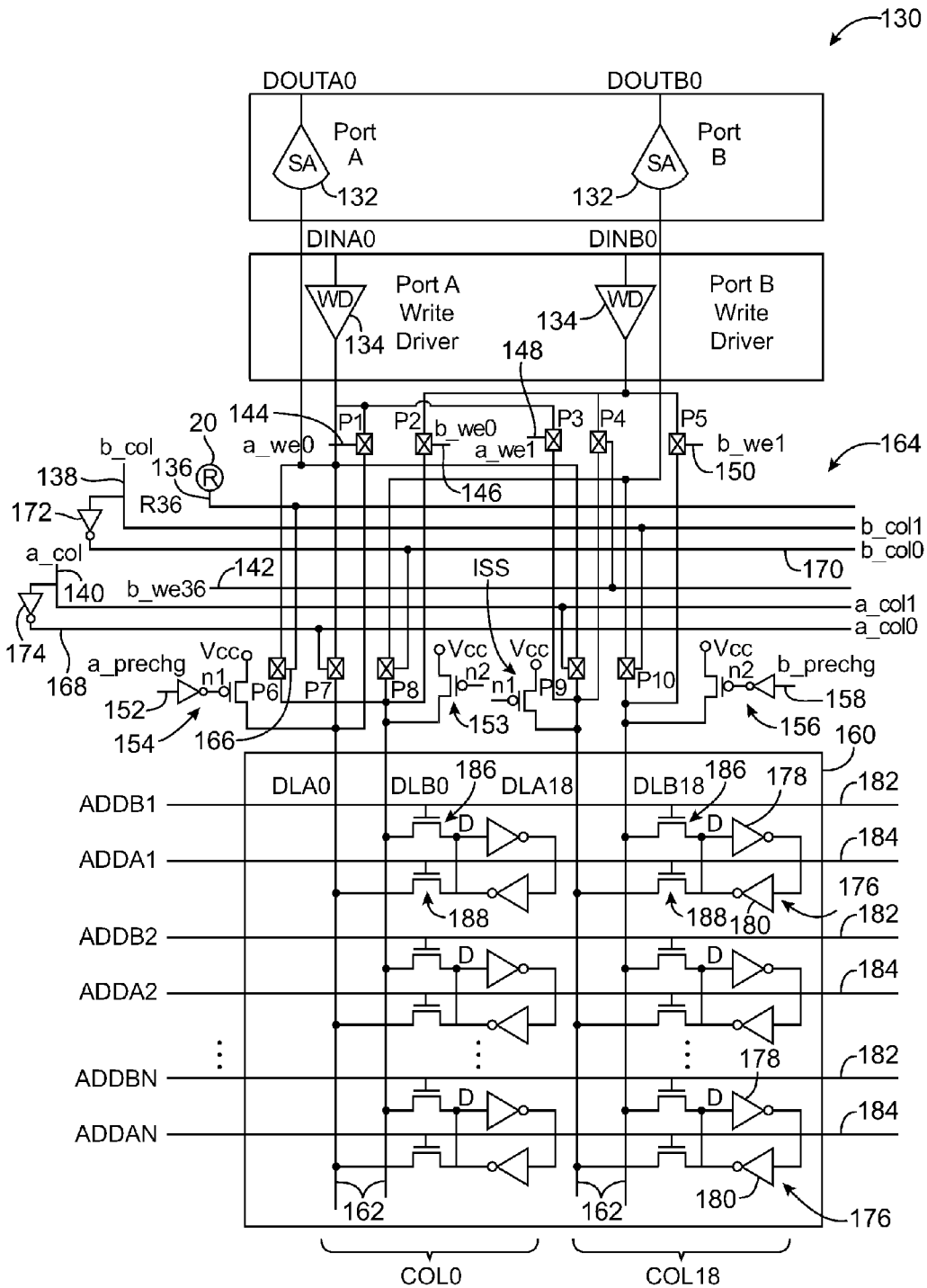
FIG. 7 is a diagram of an illustrative slice of a configurable memory array with multiplexing circuitry in accordance with an embodiment of the present invention.

A slice 130 of a configurable dual port memory array in accordance with an embodiment of the present invention is shown in FIG. 7. Slice 130 has sense amplifiers 132 for reading data from memory cell array 160 via data lines 162 (also sometimes referred to as bit lines). Output data that has been read from array 160 is provided at the outputs of sense amplifiers 132. The port A sense amplifier 132 provides output data signal DOUTA0. The port B sense amplifier 132 provides output data signal DOUTB0. Write drivers 134 drive data signals onto data lines 162 during write operations. The port A write driver handles data input signal DINA0. The port B write driver handles data input signal DINB0.

Precharge drivers 154, 153, 155, and 156 may be used to precharge data lines 162 to a positive power supply voltage Vcc prior to read operations. The port A precharge drivers 154 and 155 may be controlled by precharge control signal a_prechg. The port B precharge drivers 153 and 156 may be controlled by precharge control signal b_prechg.

Multiplexer circuitry 164 has ten pass gates, labeled P1 through P10. Pass gates P1-P5 are preferably NMOS pass gates. Pass gates P6-P10 are preferably PMOS pass gates. Pass gate P1 is controlled by control signal a_we0 on line 144. Pass gate P2 is controlled by control signal b_we0 on line 146. Pass gate P3 has a control terminal 148 that receives a control signal a_we1. Pass gate P4 a control terminal that receives control signal b_we36 from line 142. Line 142 is connected to the output of AND gate 52 in FIG. 2. Pass gate P5 is controlled by control signal b_we1 on control input 150. A memory element 20 may be used to supply a control signal R36 on line 136. Control signal R36 is provided to control input terminal 166 of pass gate P6. Pass gate P7 has its control input terminal coupled to line 168, which receives control signal a_col0. Pass gate P8 receives control signal b_col0 from line 170 at its control terminal. Control signal a_col1 is provided to the control terminal of pass gate P9. Pass gate P10 is controlled by control signal b_col1 at its control terminal.

Inverters 172 and 174 are used to invert the signal b_col from line 138 and signal a_col from line 140 to produce signals b_col0 and a_col0, respectively. Signal b_col1 is equal to signal b_col. Signal a_col1 is equal to signal a_col.

Array 160 has memory cells 176 that are formed from cross-coupled inverters 178 and 180. Memory cells 176 are addressed using port B row address lines 182 and port A row address lines 184. Address transistors 186 are associated with row address lines 182. Address transistors 188 are associated with row address lines 184. There are two address transistors for each cell 176, one for the port A data lines DLA such as data lines DLA0 and DLA18 in slice 130 and one for the port B data lines DLB such as data lines DLB0 and DLB18 in slice 130.

The signal on node D in each cell 178 represents the data stored in that cell.

Control signal R36 is low for true or simple dual port reading in data width modes x1-x18 and is high for simple dual port x36 read operations. Control signal W36 is high for simple dual port write operations in x36 mode and is low for x1 to x18 data width modes (in both true and simple dual port modes).

The control signals a_col and b_col may be used to select which set of columns in the memory array are accessed.

During a read operation in x36 simple dual port mode, signal R36 is high and signal b_col is high. Both the port A and port B sense amplifiers are used for reading out data from the DLB lines (i.e., lines DLB0 and DLB18). The row address for the read operation is established by asserting a desired port B address line 182. Pass gate P6 is on because R36 is high. Pass gate P10 is on because b_col is high. With pass gate P6 on, data line signal DLB0 is routed to data output DOUTA0 through the port A sense amplifier 132. With pass gate P10 on (and pass gate P8 off), the signal on data line DLB18 is routed to data output DOUTB0 through the port B sense amplifier 132. In each of these scenarios, the data signals that are being read from the array need only traverse a single PMOS pass gate. Both the A and B port sense amplifiers are used to read out data using the DLB lines and therefore form a x36 simple dual port read port. While data is being read from the array using this read port, data may be simultaneously written using a write port configured in a by-one to by-36 data width mode.

During a write operation in x36 simple dual port mode, control signal b_we36 is high. As a result, pass gate P4 is on. The port A write driver 134 receives data input signal DINA0. Write enable control signal a_we0 is high on line 144, so pass gate P1 is on, connecting the output of the port A write driver 134 to data line DLA0. The data input signal DINA0 is therefore routed to data line DLA0. The port B write driver 134 receives data input signals DINB0 and routes the DINB0 signal onto data line DLA18 via pass gate P4. Because both the A and B port write drivers are used to write data into the array using the DLA lines, the port A and B write drivers form a x36 simple dual port mode write port. While data is being written into the array using this write port, data may be simultaneously read using a read port (which can be configured in a data width mode ranging from x1 to x36).

In data width modes of x18 or less (in simple dual port mode or true dual port mode), control signals R36 and b_we36 are low.

Port A read operations may be performed by taking write enable control signals a_we0 and a_we1 low. If control signal a_col is high, pass gate P9 will be on and pass gate P7 will be off, so data will be routed from data line DLA18 to data output DOUTA0 via pass gate P9 and port A sense amplifier 132. If a_col is low, pass gate P9 will be off and pass gate P7 will be on, so the signal on data line DLA0 will be routed to data output DOUTA0 through the port A sense amplifier 132.

Port A write operations may be controlled using write enable signals a_we0 and a_we1. If control signal a_we0 is high and control signal a_we_1 is low, pass gate P1 will be turned on and pass gate P3 will be turned off. In this situation, data input signal DINA0 will be driven onto data line DLA0 by the port A write driver 134 via pass gate P1. If a_we0 is low and a_we1 is high, pass gate P1 will be off and pass gate P3 will be on. In this situation, data input signal DINA0 will be driven onto data line DLA18 through pass gate P3 by the port A write driver 134.

Port B read operations may be performed by taking control signals b_we0 and b_we1 low. If control signal b_col1 is high, pass gate P10 will be on and pass gate P8 will be off. In this configuration, the signal on data line DLB18 will be routed to data output DOUTB0 through the port B sense amplifier 70. If control signal b_col1 is low, pass gate P10 will be off and pass gate P8 will be on, so the signal on data line DLB0 will be routed to data output DOUTB0 through the port B sense amplifier 132.

Port B write operations may be controlled using write enable signals b_we0 and b_we1. When signal b_we0 is high and b_we1 is low, pass gate P2 is on and pass gate P5 is off. In this situation, input data signal DINB0 is routed to data line DLB0 through the port B write driver 134 and pass gate P2. When signal b_we0 is low and b_we1 is high, pass gate P2 is off and pass gate P5 is on. In this situation, input data signal DINB0 is routed to data line DLB18 through the port B write driver 134 and pass gate P5.

A truth table of write-path multiplexer control signals for circuitry of the type shown in FIG. 7 is shown in FIG. 8.

As described in connection with FIG. 7, NMOS pass gates P1 to P5 are on the write path in multiplexer circuitry 164 between data inputs DIN and memory cells 176. Because pass gates P1 to P5 are used exclusively for writing, it is possible to use NMOS pass gates in place of conventional CMOS pass gates, thereby reducing circuit loading and improving write performance. In true dual port mode, the write driver 134 of each port can access different data lines in the array via the 2:1 multiplexers formed in multiplexer circuitry 164. For example, in slice 130, the write drivers 134 can access data line 0 or data line 18 via a 2:1 multiplexer (formed from pass gates P1 and P3 for port A and formed from pass gates P2 and P5 for port B). Selection of desired data lines for writing is controlled by the most significant bit (MSB) of the column address control signals. In simple dual port mode, port A write driver 134 always drives data line DLA0 while pass gate P4 connects port B write driver 134 to data line DLA18 to support simple dual port x36 write operations. The pass gate control signals a_we0, a_we1, b_we0, b_we1 and b_we36 contain operating mode and address information and are gated by write enable control signals (a_we/b_we), as shown in table 190 of FIG. 8.

A truth table of read-path multiplexer control signals for circuitry of the type shown in FIG. 7 is shown in FIG. 9.

As described in connection with FIG. 7, pass gates P6 to P10 are on the read path in multiplexer circuitry 164 between memory cells 176 and data outputs DOUT. In true dual port mode, the sense amplifiers 132 of each port can access different data lines in the memory array using 2:1 multiplexers formed in multiplexer circuitry 164. For example, in slice 130, sense amplifiers 132 can access data line 0 or data line 18 via a 2:1 multiplexer (formed from pass gates P7 and P9 for port A or pass gates P8 and P10 for port B). This multiplexer circuitry is controlled by the most significant bit of the column address. In simple dual port mode, port B sense amplifier 132 always reads from data line DLB18 (in slice 130) while pass gate P6 connects port A sense amplifier 132 to data line DLB0 to support simple dual port x36 read operations. The pass gate control signals a_col0, a_col1, b_col0, b_col1 and R36 contain operating mode and address information and are gated by read enable control signals (a_re/b_re) as shown in table 9. Read enable signal a_re is high when signals a_we0 and a_we1 are both low. Read enable signal b_re is high when signals b_we0 and b_we1 are both low.

As shown schematically in FIG. 7, prechargers 154, 153, 155, and 156 may be located closer to memory cells 176 than in conventional schemes of the type described in connection with FIG. 3. In the conventional arrangement of FIG. 3, each precharge driver precharges a pair of data lines. For example, the port A precharger 88 in slice 68 is used to precharge data lines DLA0 and DLA18. In the arrangement of FIG. 7, each pair of data lines (e.g., data lines DLA0 and DLA18) has a pair of precharge drivers (e.g., precharge drivers 154 and 155), so there is a single precharge driver associated with each data line. This minimizes the load on each precharge driver and improves performance. Moreover, unlike the conventional scheme of FIG. 3, it is not necessary for the precharge signals that are produced by the precharge drivers to traverse any of the pass gates P1-P10. This further minimizes the load on the precharge drivers and improves precharge performance by making precharge operations faster and more effective than with conventional arrangements.

In conventional arrangements of the type shown in FIG. 3, the read path and the write path each traverse two pass gates. The precharge drivers in conventional schemes must each pull up two data lines through pass gates, which can make conventional schemes susceptible to pass gate delay and device variation. With the present invention, the number of pass gate stages in multiplexer circuitry 164 is reduced so that the read path and write path only go though one pass gate each. This reduces circuit loading and makes multiplexer circuitry 164 faster and less susceptible to device variation. Because the read path and write path are separated in multiplexer circuitry 164, the pass gates on the read paths can be implemented using PMOS transistors and the pass gates on the write paths can be implemented using NMOS transistors. This reduces layout area and circuit loading and allows read and write operations to be performed more rapidly than with conventional arrangements of the type described in connection with FIG. 3.

The foregoing is merely illustrative of the principles of this invention and various modifications can be made by those skilled in the art without departing from the scope and spirit of the invention.

What is claimed is:

1. Configurable dual port memory array circuitry comprising:
   an array of memory cells having a plurality of associated data lines;
   multiplexer circuitry coupled to the data lines that contains pass gates and that is configurable to support operation of the configurable dual port memory array circuitry in a true dual port mode and a simple dual port mode;
   a plurality of sense amplifiers that read data from the memory cells through read paths in the multiplexer circuitry; and
   a plurality of write drivers that write data into the memory cells through write paths in the multiplexer circuitry, wherein all of the read paths in the multiplexer circuitry each contain no more than one pass gate.

2. The configurable dual port memory array circuitry defined in claim 1 further comprising precharge drivers, wherein the precharge drivers are connected to the data lines with no intervening pass gates.

3. The configurable dual port memory array circuitry defined in claim 1 wherein there are at least ten pass gates associated with each pair of columns of the memory cells and wherein at least five of the ten pass gates comprise n-channel metal-oxide-semiconductor pass gates.

4. The configurable dual port memory array circuitry defined in claim 1 wherein there are at least ten pass gates associated with each pair of columns of the memory cells and wherein at least five of the ten pass gates comprise p-channel metal-oxide-semiconductor pass gates.

5. The configurable dual port memory array circuitry defined in claim 1 wherein all of the write paths in the multiplexer circuitry each contain no more than one pass gate.

6. The configurable dual port memory array circuitry defined in claim 1 wherein half of the pass gates in the multiplexer circuitry comprise n-channel metal-oxide-semiconductor pass gates and wherein half of the pass gates in the multiplexer circuitry comprise p-channel metal-oxide-semiconductor pass gates.

7. The configurable dual port memory array circuitry defined in claim 1 wherein half of the pass gates in the multiplexer circuitry are associated with the write paths and comprise n-channel metal-oxide-semiconductor pass gates and wherein half of the pass gates are associated with the read paths in the multiplexer circuitry and comprise p-channel metal-oxide-semiconductor pass gates.

8. The configurable dual port memory array circuitry defined in claim 1 wherein each memory cell comprises:
   a pair of cross-coupled inverters;
   a first address transistor; and
   a second address transistor, wherein the first address transistor in each memory cell is connected to a first row address line and wherein the second address transistor in each memory cell is connected to a second row address line.

9. The configurable dual port memory array circuitry defined in claim 1 wherein all of the write paths in the multiplexer circuitry each contain no more than one pass gate and further comprising precharge drivers that precharge the data lines before data is read from the memory cells, wherein the memory cells are arranged in rows and columns, wherein a pair of the data lines is associated with each of the columns of memory cells, and wherein each of the precharge drivers is associated with only a single one of the data lines.

10. The configurable dual port memory array circuitry defined in claim 1 further comprising precharge drivers that precharge the data lines before data is read from the memory cells, wherein each memory cell comprises:
   a pair of cross-coupled inverters;
   a first address transistor;
   a second address transistor, wherein the first address transistor in each memory cell is connected to a first row address line and wherein the second address transistor in each memory cell is connected to a second row address line, wherein the memory cells are arranged in rows and columns, wherein a pair of the data lines is associated with each of the columns of memory cells, and wherein each of the precharge drivers is associated with only a single one of the data lines.

11. The configurable dual port memory array circuitry defined in claim 1 further comprising precharge drivers that precharge the data lines before data is read from the memory cells, wherein each memory cell comprises:
   a pair of cross-coupled inverters;
   a first address transistor;
   a second address transistor, wherein the first address transistor in each memory cell is connected to a first row address line and wherein the second address transistor in each memory cell is connected to a second row address line, wherein the memory cells are arranged in rows and columns, wherein a pair of the data lines is associated with each of the columns of memory cells, wherein each of the precharge drivers is associated with only a single one of the data lines, and wherein at least one of the read paths contains a p-channel metal-oxide-semiconductor pass gate.

12. The configurable dual port memory array circuitry defined in claim 1 further comprising precharge drivers that precharge the data lines before data is read from the memory cells, wherein each memory cell comprises:
   a pair of cross-coupled inverters;
   a first address transistor;
   a second address transistor, wherein the first address transistor in each memory cell is connected to a first row address line and wherein the second address transistor in each memory cell is connected to a second row address line, wherein the memory cells are arranged in rows and columns, wherein a pair of the data lines is associated with each of the columns of memory cells, wherein each of the precharge drivers is associated with only a single one of the data lines, wherein each read path contains a p-channel metal-oxide-semiconductor pass gate, and wherein all of the write paths in the multiplexer circuitry each contain no more than one pass gate.

13. The configurable dual port memory array circuitry defined in claim 1 further comprising precharge drivers that precharge the data lines before data is read from the memory cells, wherein each memory cell comprises:
   a pair of cross-coupled inverters;
   a first address transistor;
   a second address transistor, wherein the first address transistor in each memory cell is connected to a first row address line and wherein the second address transistor in each memory cell is connected to a second row address line, wherein the memory cells are arranged in rows and columns, wherein a pair of the data lines is associated with each of the columns of memory cells, wherein each of the precharge drivers is associated with only a single one of the data lines, wherein each write path comprises an n-channel metal-oxide-semiconductor pass gate, and wherein at least one of the pass gates comprises a p-channel metal-oxide-semiconductor pass gate.

14. The configurable dual port memory array circuitry defined in claim 1 further comprising precharge drivers that precharge the data lines before data is read from the memory cells, wherein each memory cell comprises:
   a pair of cross-coupled inverters;
   a first address transistor;
   a second address transistor, wherein the first address transistor in each memory cell is connected to a first row address line and wherein the second address transistor in each memory cell is connected to a second row address line, wherein the memory cells are arranged in rows and columns, wherein a pair of the data lines is associated with each of the columns of memory cells, wherein each of the precharge drivers is associated with only a single one of the data lines, wherein at least one of the write paths contains an n-channel metal-oxide-semiconductor pass gate, wherein at least one of the read paths contains a p-channel metal-oxide-semiconductor pass gate, and wherein the precharge drivers are connected to the data lines with no intervening pass gates.

15. The configurable dual port memory array circuitry defined in claim 1 further comprising precharge drivers that precharge the data lines before data is read from the memory cells, wherein each memory cell comprises:
   a pair of cross-coupled inverters;
   a first address transistor;
   a second address transistor, wherein the first address transistor in each memory cell is connected to a first row address line and wherein the second address transistor in each memory cell is connected to a second row address line, wherein the memory cells are arranged in rows and columns, wherein some of the pass gates are associated with the write paths and comprise n-channel metal-oxide-semiconductor pass gates, and wherein all of the write paths in the multiplexer circuitry each contain no more than one pass gate.

16. The configurable dual port memory array circuitry defined in claim 1 further comprising programmable memory elements that configure the multiplexer circuitry and precharge drivers that precharge the data lines before data is read from the memory cells, wherein each memory cell comprises:
   a pair of cross-coupled inverters;
   a first address transistor;
   a second address transistor, wherein the first address transistor in each memory cell is connected to a first row address line and wherein the second address transistor in each memory cell is connected to a second row address line, wherein the memory cells are arranged in rows and columns, and wherein some of the pass gates are associated with the read paths and comprise p-channel metal-oxide-semiconductor pass gates.

17. The configurable dual port memory array circuitry defined in claim 1 further comprising programmable memory elements that configure the multiplexer circuitry and precharge drivers that precharge the data lines before data is read from the memory cells, wherein each memory cell comprises:
   a pair of cross-coupled inverters;
   a first address transistor;
   a second address transistor, wherein the first address transistor in each memory cell is connected to a first row address line and wherein the second address transistor in each memory cell is connected to a second row address line, wherein the memory cells are arranged in rows and columns, wherein some of the pass gates are associated with the write paths and comprise n-channel metal-oxide-semiconductor pass gates, and wherein some of the pass gates are associated with the read paths and comprise p-channel metal-oxide-semiconductor pass gates.

18. The configurable dual port memory array circuitry defined in claim 1 further comprising precharge drivers that precharge the data lines before data is read from the memory cells, wherein each memory cell comprises:
   a pair of cross-coupled inverters;
   a first address transistor;
   a second address transistor, wherein the first address transistor in each memory cell is connected to a first row address line and wherein the second address transistor in each memory cell is connected to a second row address line, wherein the memory cells are arranged in rows and columns, wherein some of the pass gates are associated with the write paths and comprise n-channel metal-oxide-semiconductor pass gates, wherein some of the pass gates are associated with the read paths and comprise p-channel metal-oxide-semiconductor pass gates, and wherein the precharge drivers are connected to the data lines with no intervening pass gates.

19. A programmable logic device integrated circuit comprising:
   programmable logic;
   at least one configurable dual port memory array that is configurable to operate in a true dual port mode and simple dual port mode, wherein the configurable dual port memory array comprises:
      an array of memory cells having a plurality of associated data lines;
      multiplexer circuitry coupled to the data lines that contains pass gates and that is configurable to support operation of the configurable dual port memory array circuitry in a true dual port mode and a simple dual port mode;
      a plurality of sense amplifiers that read data from the memory cells through read paths in the multiplexer circuitry; and
      a plurality of write drivers that write data into the memory cells through write paths in the multiplexer circuitry, wherein all of the write paths in the multiplexer circuitry each contain no more than one pass gate.

20. The programmable logic device defined in claim 19 wherein all of the read paths in the multiplexer circuitry each contain no more than one pass gate and wherein the memory array further comprises precharge drivers that precharge the data lines before data is read from the memory cells, wherein each memory cell comprises:
   a pair of cross-coupled inverters;
   a first address transistor; and
   a second address transistor, wherein the first address transistor in each memory cell is connected to a first row address line and wherein the second address transistor in each memory cell is connected to a second row address line, wherein the memory cells are arranged in rows and columns, wherein some of the pass gates are associated with the write paths and comprise n-channel metal-oxide-semiconductor pass gates, wherein some of the pass gates are associated with the read paths and comprise p-channel metal-oxide-semiconductor pass gates, and wherein the precharge drivers are connected to the data lines with no intervening pass gates.

* * * * *